United States Patent [19]

Chan et al.

[11] Patent Number: 5,302,271
[45] Date of Patent: Apr. 12, 1994

[54] ANODIC VACUUM ARC DEPOSITION SYSTEM

[75] Inventors: Chung Chan, West Newton; Steven Meassick, Sharon, both of Mass.

[73] Assignee: Northeastern University, Boston, Mass.

[21] Appl. No.: 934,925

[22] Filed: Aug. 25, 1992

[51] Int. Cl.$^5$ .............................................. C23C 14/32
[52] U.S. Cl. ........................... 204/298.41; 204/192.38; 427/580
[58] Field of Search ....................... 204/192.38, 298.41; 427/580

[56] References Cited

U.S. PATENT DOCUMENTS

| | | | |
|---|---|---|---|
| 3,158,805 | 11/1964 | Kalbfell | 360/1 |
| 4,917,786 | 4/1990 | Ehrich | 204/192.38 |
| 5,013,578 | 5/1991 | Brown et al. | 427/455 |
| 5,096,558 | 3/1992 | Ehrich | 204/192.38 |

OTHER PUBLICATIONS

"A Review of Anode Phenomena in Vacuum Arcs", by H. Craig Miller, IEEE Transactions on Plasma Science, vol. PS-13, Oct. 1985, pp. 242-252.
"Corrosion Protection By Vacuum Arc Coatings", by S. Bababeyge, et al., Interfinish 88, Paris, Oct. 1988.
"Transport of Vacuum Arc Plasma Through Straight and Curved Magnetic Cuts", by J. Storer, et al., Journal of Applied Physics, vol. 66, No. 11, Dec. 1989, pp. 5245-5249.
"Anode Voltage Drop and Anode Spot Formation in dc Vacuum Arcs" by C. W. Kimblin, Journal of Applied Physics, vol. 40, No. 4, Mar. 1969, pp. 1744-1752.
"The Anode Vacuum Arc. I. Basic Construction and Phenomenology", by H. Ehrick, Jun. 1987, pp. 134-138.
"Anodic Vacuum Arc. II. Experimental Study of Arc Plasma", by H. Ehrick, et al., Sep. 1987, pp. 2499-2503.
"Principles and Applications of Vacuum Arc Coatings", by R. L. Boxman, et al., XIIIth Internation Symposium on Discharges and Electrical Insulation in Vacuum, Paris, 1988.
"Anode Surface Radiance From Microsecond Vacuum Arcs", by J. T. Grissom, et al., Journal of Applied Physics, vol. 45, No. 7, Jul. 1974, pp. 2885-2894.
"Vacuum Arc Anode Plasma I. Spectroscopic Investigation", by F. M. Bacon, Journal of Applied Physics, vol. 46., No. 11, Nov. 1975, pp. 4750-4757.

Primary Examiner—Aaron Weisstuch
Attorney, Agent, or Firm—Weingarten, Schurgin, Gagnebin & Hayes

[57] ABSTRACT

An anodic vacuum arc deposition system for rapidly depositing a high quality, small grain size, coating on a workpiece. The anodic vacuum arc deposition system includes an arc initiator and an anodic electrode having a continuous feed. The anodic vacuum arc deposition system may be configured with a coaxial anode and cathode. A plurality of coaxial electrodes may be used to deposition coat a large area and/or to sequentially deposit a series of layers each of a different material.

14 Claims, 6 Drawing Sheets

ANODIC VACUUM ARC DEPOSITION SYSTEM

BACKGROUND OF THE INVENTION

The deposition of material upon a substrate by the use of an electric arc is well known. FIG. 1 depicts a typical deposition apparatus 10. The process takes place in a vacuum chamber 12 which encloses a substrate 14 which is to be and an electric arc electrode assembly 16, having an anode 18 and a cathode 20. Material 24 to be deposited is placed in a receptacle 26 formed in the cathode 20 of the electric arc electrode assembly 16. The substrate 14 to be coated is placed near the electric arc electrode assembly 16. A potential is applied between the anode 18 and the cathode of the electric arc electrode assembly 16 and current flows between them, once the arc is ignited. As current flows between the cathode 20 and the anode 18, the material 24 to be deposited is vaporized and ionized forming a plasma 30 which maintains current flow even as the anode 18 and the cathode 20 are physically separated. The ions of the plasma 30 interact with the surface of the substrate 14 to be coated and are deposited thereupon. It should be noted, in the case where the cathode 20 is constructed from the material 24 to deposited, the cathode 20 need not contain a receptacle 24 and instead the cathode 20 itself is consumed in the deposition process. This form of deposition, in which material is deposited from the cathode region, may be termed cathodic vacuum arc deposition.

Alternatively, the anode 18 of the electric arc electrode assembly 16 may be used as the source of the material to be deposited. In such a case, where the material is deposited from the anode region, the deposition is referred to as anodic vacuum arc deposition.

In anodic vacuum arc deposition, an electric arc 30, which forms between the anode 18 and the cathode 20, is initiated by physical contact between the anode 18 and cathode 20. Once the electric arc 30 forms or ignites, the anode 18 and the cathode 20 are separated and the arc is maintained by the material ionized during initiation.

SUMMARY OF THE INVENTION

An anodic vacuum arc deposition system is described herein for rapidly depositing a high quality, small grain size, coating on a substrate workpiece. The anodic vacuum arc deposition system includes a liquid anodic electrode which includes a continuous feed. The anodic vacuum arc deposition system includes an electric arc initiator and may be configured as a coaxial anode and cathode. A plurality of coaxial electrodes may used to deposition coat a large area and/or to sequentially deposit a series of layers each of a different material.

BRIEF DESCRIPTION OF THE DRAWINGS

Other benefits and features of the invention can be more clearly understood with reference to the specification and the accompanying drawing in which.

DESCRIPTION OF THE PREFERRED EMBODIMENT

Figure 2:
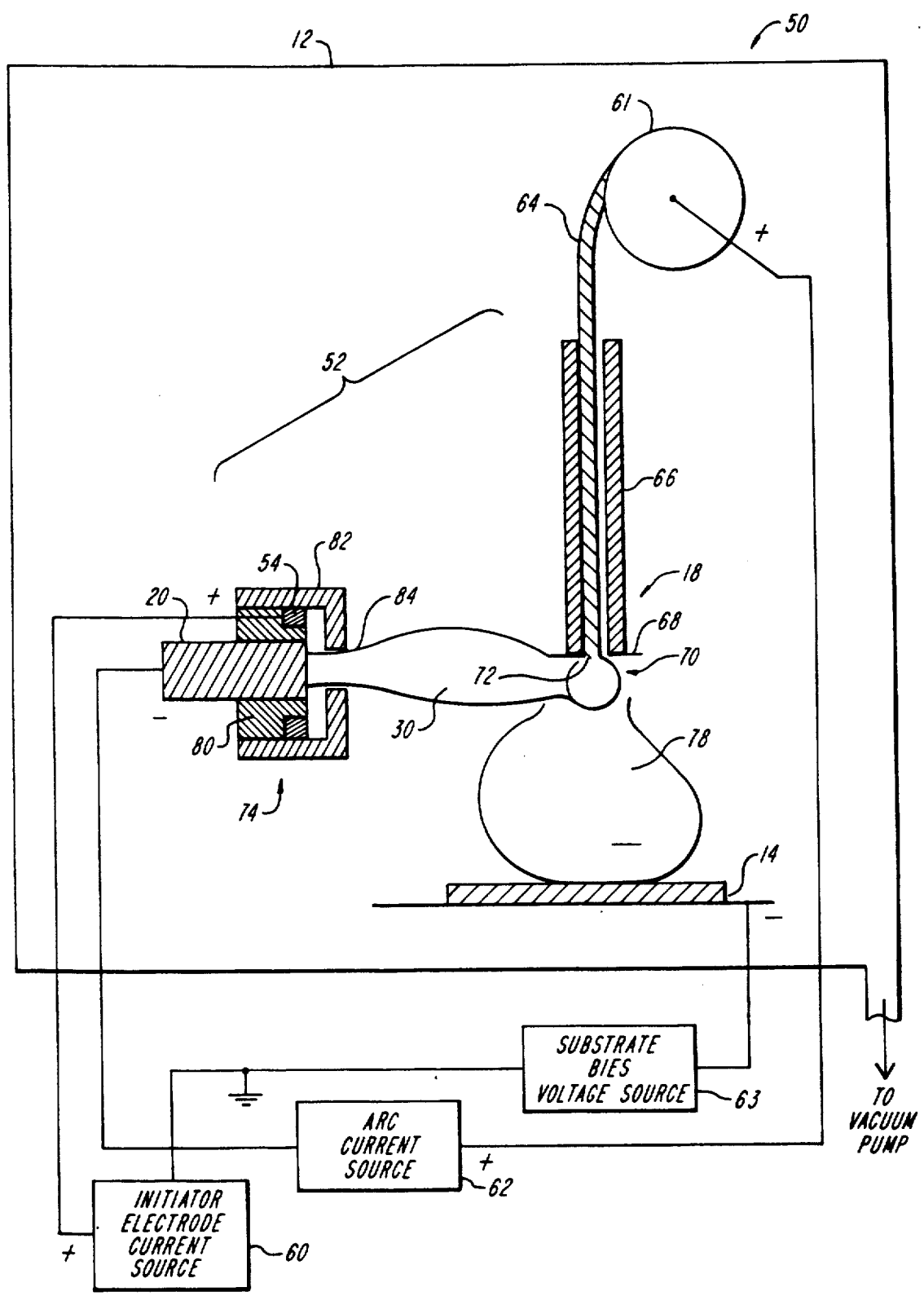
FIG. 2 depicts an embodiment of the anodic vacuum arc system of the invention.

Referring to FIG. 2, an embodiment 50 of the anodic vacuum arc system of the invention, in brief overview, includes a vacuum chamber 12 which encloses a substrate 14 to be coated and an electric arc electrode assembly 52, having an anode electrode 18, a cathode electrode 20 and an initiator electrode 54. In one embodiment the vacuum chamber 12 is maintained at $10^{-5}$ torr. An initiator electrode current source 60 and an arc current source 62 provide the current necessary for initiating and sustaining, respectively, the electric arc 30. A substrate bias voltage source 63 provides a negative bias voltage to the substrate 14. The substrate bias voltage may be varied between 0 and −400 volts to provide an ion assist to the deposition material. The specific bias voltage used is determined by the specific substrate and the specific coating being deposited. Typically a high voltage provides the ion assist required for high adhesion. However, too high a bias voltage may result in ion implantation rather than surface coating and may result in the arc discharge shifting from between the anode 18 and the cathode 20, to between the anode 18 and the substrate 14.

Considering the electric arc electrode assembly 52 in more detail, and remembering that the values discussed are exemplary, the anode 18 of the electric arc electrode assembly 52 includes a spool 61 of anodic wire 64 which is 0.2 cm in diameter. The spool 61 is connected to the positive terminal of the arc current source 62 in such a way that current from the arc current source 62 is permitted to flow through the anodic wire 64. The non-spooled end of the anodic wire 64 passes through an insulating tube 66, which has an outer diameter of 0.5 cm, and which is terminated at one end by an insulating limiter 68. The insulating limiter 68 includes an aperture 72 through which current flows between the cathode 20 and the anode 18.

When the electric arc 30 forms, the anodic wire 64 melts, forming a ball 70 of molten material adjacent the insulating limiter 68. As the anodic wire 64 is vaporized and ionized, the spool 61 is rotated so as to feed the anodic wire 64 through the insulating tube 66 at the same rate as material is being vaporized and ionized from the ball 70 of molten material. This keeps the ball 70 of molten material adjacent the limiter 68 and constantly provides new liquid anodic material for deposition.

It is the liquefaction of the anode material that is the reason that the anode configuration is termed a liquid anode. An anode may be a liquid anode provided that the anode is small enough to permit the heat generated by the current to build up sufficiently to melt the anodic material. Additionally, the cathode 20, which is discussed below, must be large enough and/or be provided with cooling means such that the cathode material does not melt.

The size of the ball 70 of molten material is determined by the surface tension of the molten material, the degree to which the molten material will adhere to the anodic wire 64 and the temperature of the molten material. The first two properties are determined by the material to be deposited and hence the size of the ball 70 can be controlled by maintaining the current flow such that the material reaches its melting temperature but does not lose so much surface tension that the molten ball 70 drops from the anodic wire 64.

It should be noted that although the electrode assembly is shown oriented vertically, such need not be the case. It should also be noted that the spool 61 need not be placed within the vacuum chamber 12 as long as the anodic wire 64 is permitted to enter the vacuum chamber 12 without affecting the vacuum. The spool 61 may be rotated at the proper rate by means of a motor either under the control of a feedback loop or at a precalculated rate.

Figure 4A:
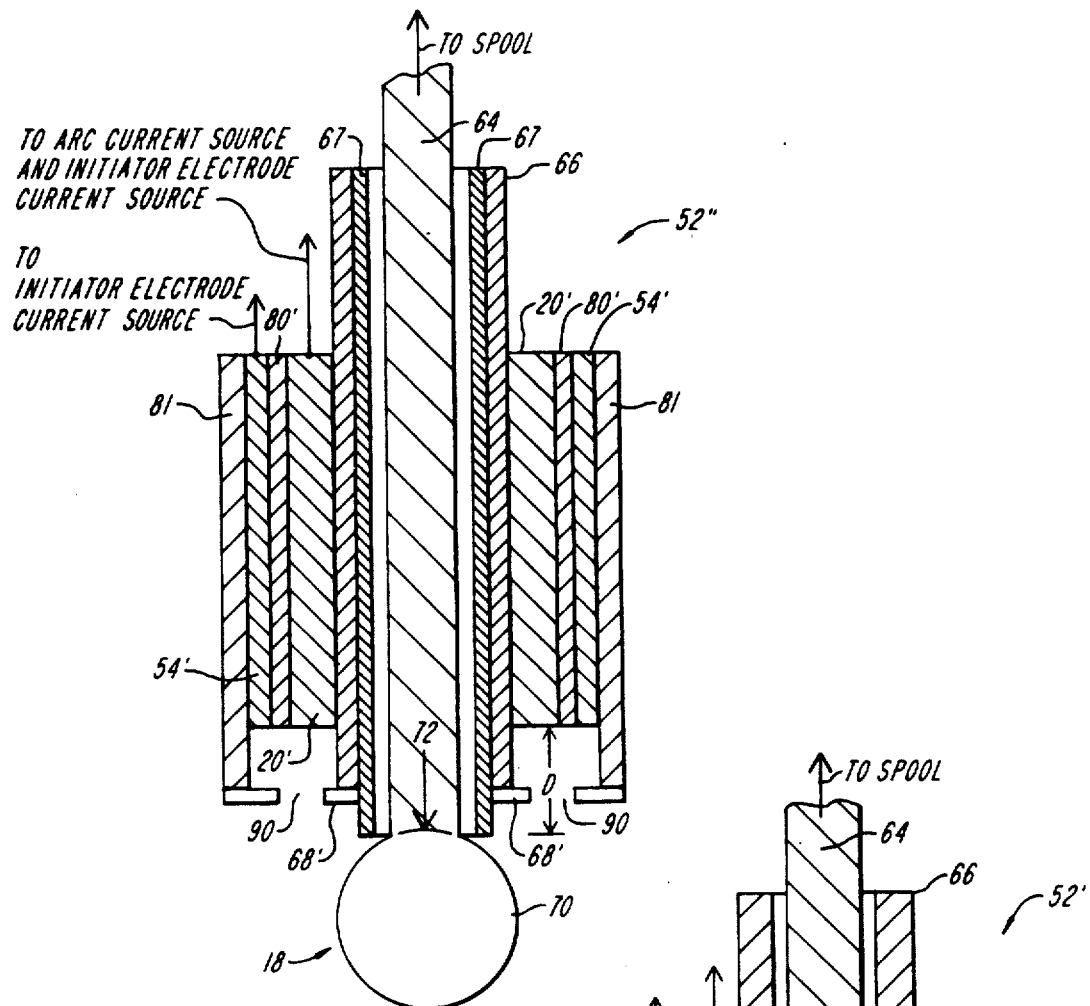
FIG. 4a is a cross-sectional diagram of another embodiment of a coaxial electrode assembly of the invention.

To deposit certain materials having a high melting temperature, such as tungsten or carbon, it may be necessary to provide an additional high temperature sink adjacent the insulating tube 66 to prevent the material of the insulating tube 66 from melting. FIG. 4a depicts an alternate embodiment of the anode assembly 52" in which a tube of tungsten 67 separates the insulating tube 66 from the molten material 70. The tungsten tube 67 is of a size sufficient to dissipate heat and thereby prevent the insulating tube 66 from melting.

The cathode portion 74 of the electric arc electrode assembly 52 includes a cylindrical cathode 20 0.5 cm in diameter, which is electrically connected to the negative terminal of the arc current source 62 and which is electrically insulated from and encircled by an annular initiator electrode 54, which is 0.1 cm in thickness. The initiator electrode 54 is insulated from the cathode by 0.1 cm of insulation 80. The initiator electrode 54 is connected to the positive terminal of the initiator electrode current source 60. Both the initiator electrode 54 and the cathode 20 are partially enclosed by an insulating shield 82 having a shield aperture 84. The shield aperture 84 is oriented such that the electric arc 30 is permitted to form between the anode 18 and the cathode 20 while substantially preventing any material of the cathode 20, which may be vaporized by the arc, from reaching the substrate 14. In one embodiment the shield aperture 84 is 0.4 cm in diameter when the anode 18 and the cathode 20 are separated by about 2 cm. The shield 82 may be made of any high temperature-withstanding material such as ceramic or alternatively the shield may be made of a metal which is well insulated from the cathode 20 and the initiator electrode 54.

Material, vaporized and ionized from the anode 18, is drawn by the bias voltage applied to the substrate 14 by the substrate bias voltage source 63. The substrate 14 is separated from the ball 70 of molten material by about 20 cm.

Figure 1:
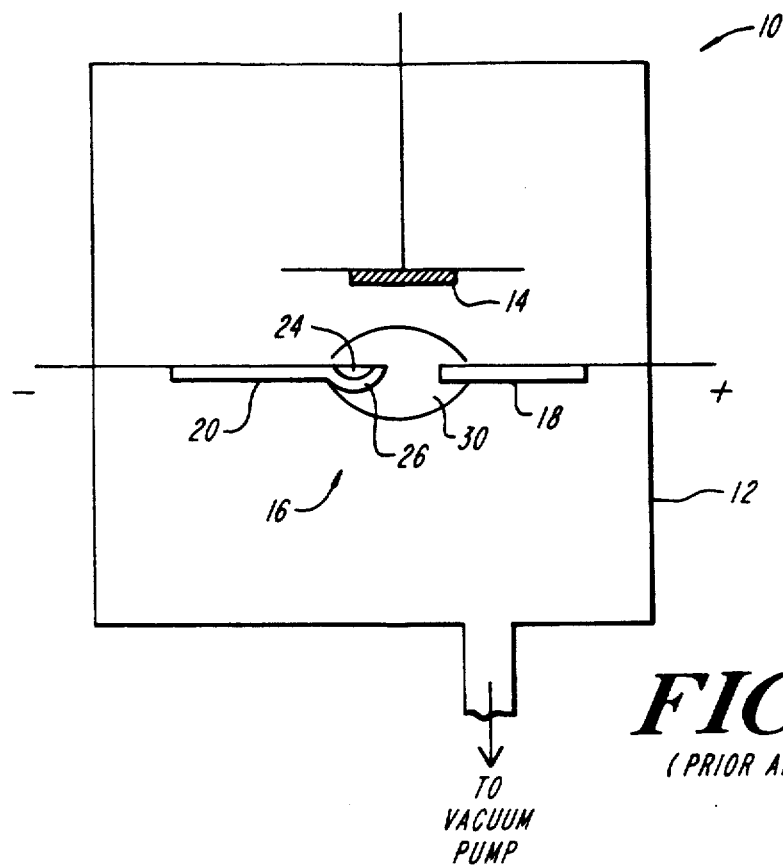
FIG. 1 depicts a cathodic vacuum arc system known to the prior art.
Figure 3A:
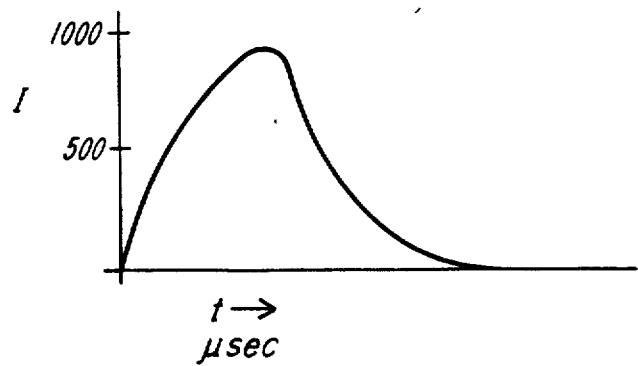
FIG. 3a is a graph of current through a resistor in the embodiment shown in FIG. 3 plotted against time.
Figure 3:
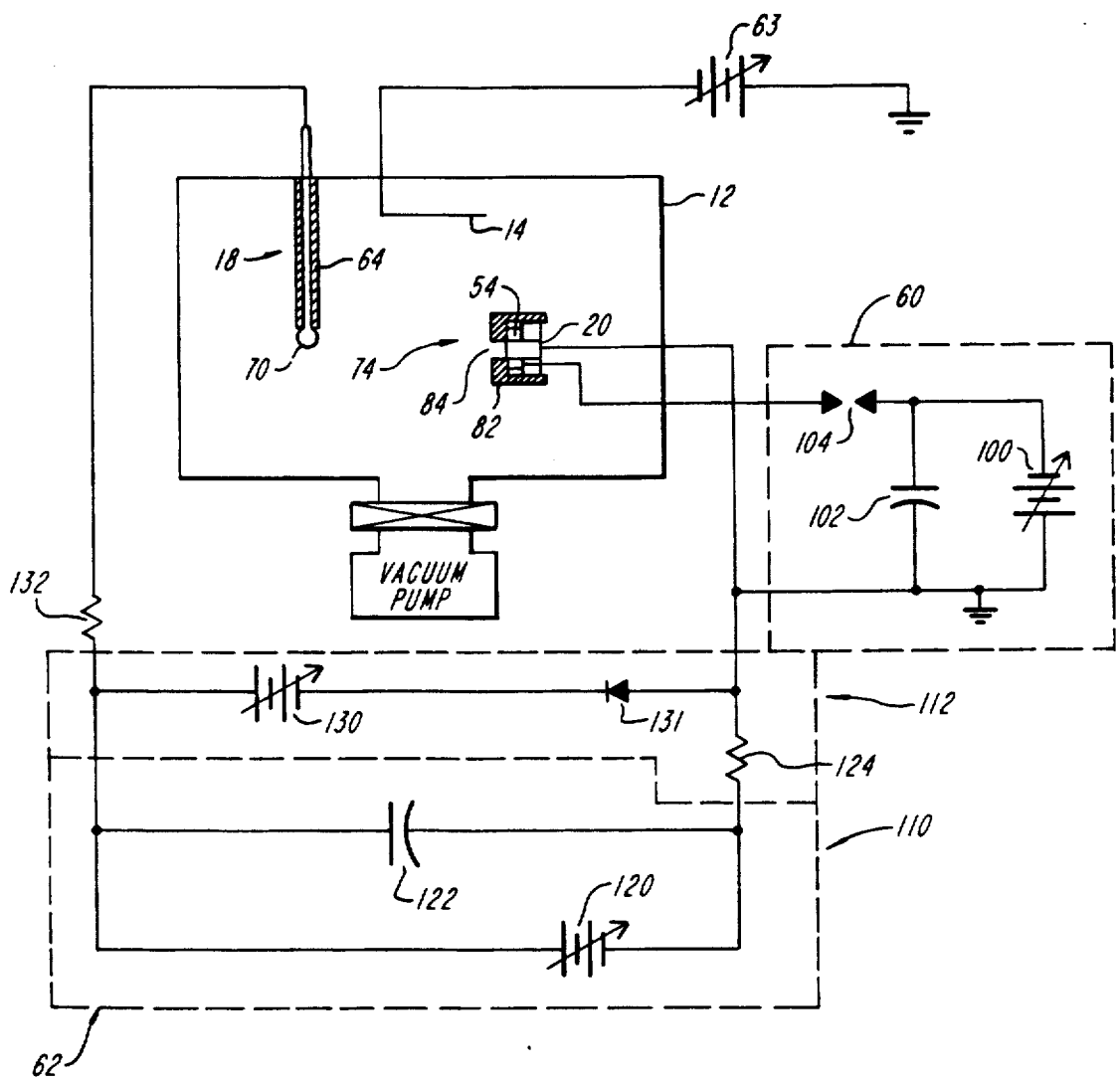
FIG. 3 is a schematic diagram of an embodiment of the external power circuits of the embodiment of the invention shown in FIG. 2.

FIG. 3 depicts the electronic components of the anodic vacuum arc system in more detail. The initiator electrode current source 60 includes a high voltage supply 100, a trigger capacitor 102 and a spark gap 104. The high voltage supply 100, producing 10K volts, charges the 0.1μF trigger capacitor 102, which discharges across the 1 mm spark gap 104 and ionizes a path between the initiator electrode 54 and the cathode 20. The value of the trigger capacitor 152, the voltage supplied by the high voltage supply 100 and the size of the spark gap 104 may be varied as required.

The arc current source 62 includes an arc initiation portion 110 and an arc sustaining portion 112. The arc initiation portion 110 includes an arc initiation supply 120 and an arc initiation capacitor 122. The arc initiation capacitor 122, in one embodiment 2500 μ F., is charged by the 200 V, 1 A current limited arc initiation supply 120. When the trigger capacitor 102 of the initiator electrode current source 60 discharges, thereby forming a plasma between the initiator electrode 54 and the cathode 20, the resulting ions permit the arc initiation capacitor 122 to discharge between the anode 18 and the cathode 20 establishing a current path. Current flows between the anode 18 and cathode 20 through a 0.25 Ω ballast resistor 132.

FIG. 3a depicts the current versus time profile of the current through a 0.1 Ω limiting resistor 124 which occurs as a result of the discharge of the initiation capacitor 122. Once the current path between the anode 18 and the cathode 20 is formed, the arc sustaining portion 112 of the arc current source 62 maintains current flow between the anode 18 and the cathode 20. The arc sustaining portion 112 includes a current limited arc current supply 130 and a diode 131. The current limited current supply 130 produces 100 A at 100 V.

Thus, to form the electric arc for deposition, the trigger capacitor 102 and the initiation capacitor 122 are charged by their respective power supplies. The trigger capacitor 102 discharges across the initiator electrode 54 and the cathode 20 forming an ionized path. The presence of ions permits the initiation capacitor 122 to discharge across the anode 18 and the cathode 20, forming an arc between the two. This arc is sustained by current supplied by the current limited arc current supply 130. The cycle in which initiation capacitor 122 and the trigger capacitor 102 are charged and discharged may be repeated until initiation of the electric arc occurs.

Figure 4:
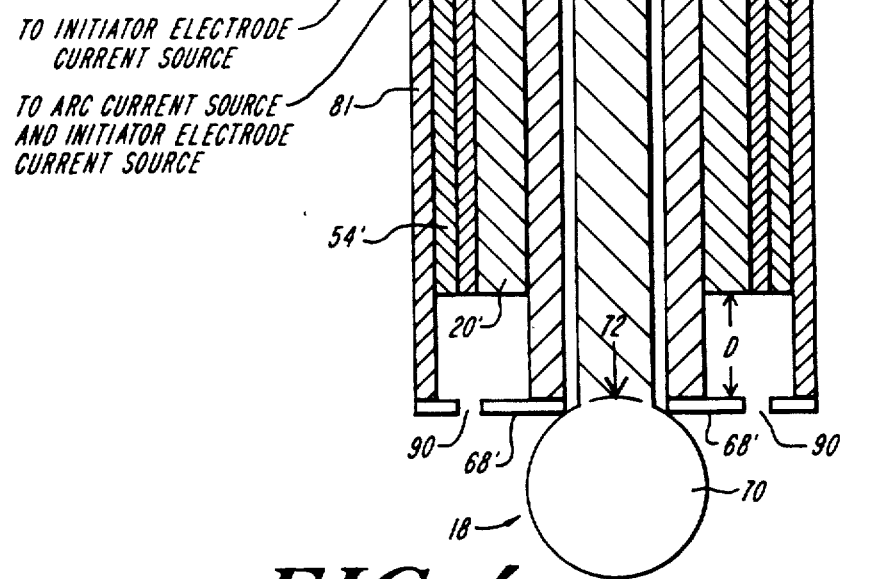
FIG. 4 is a cross-sectional diagram of an embodiment of a coaxial electrode assembly of the invention.

Although the anode 18 and the cathode 20 in the previous embodiment are depicted as separate units, such is not a requirement. An embodiment of a coaxial electrode assembly 52' in which an anode 18, a cathode 20', and an initiation electrode 54' are coaxially disposed is shown in FIG. 4. This coaxial electrode assembly 52' has at its center a 0.2 cm diameter anodic wire 64 movably positioned within a 0.5 cm outer diameter insulating tube 66 as in the previous embodiment.

An annular cathode 20' having an outer diameter of 0.7 cm is positioned concentrically about the insulating tube 66. An annular initiation electrode 54' having an outer diameter of 1.1 cm is in turn positioned concentrically about the cathode 20' and separated from the cathode 20' by an annular insulator 80' having an outer diameter of 0.9 cm. An insulator 81 having an outer diameter of 1.3 cm surrounds the coaxial electrode 52'. The cathode 20', the initiator electrode 54' and the insulator 80' are displaced from the end of the anode 62 at a distance (O), which in one embodiment is 0.3 cm. An insulating limiter 68', terminates one end of the coaxial electrode assembly 52'. The insulating limiter 68', includes a central aperture 72 for the anode 62 and an annular aperture 90 for the cathode 20'.

In this embodiment, as in the previous embodiment, the trigger capacitor 102 discharges across the initiator electrode 54' and the cathode 20', permitting the initiation capacitor 122 to discharge across the anode 18 and the cathode 20' forming an electric arc. As the arc is sustained the anodic material melts forming a molten ball 70 from which the anodic metal vapor/plasma expands.

Figure 5:
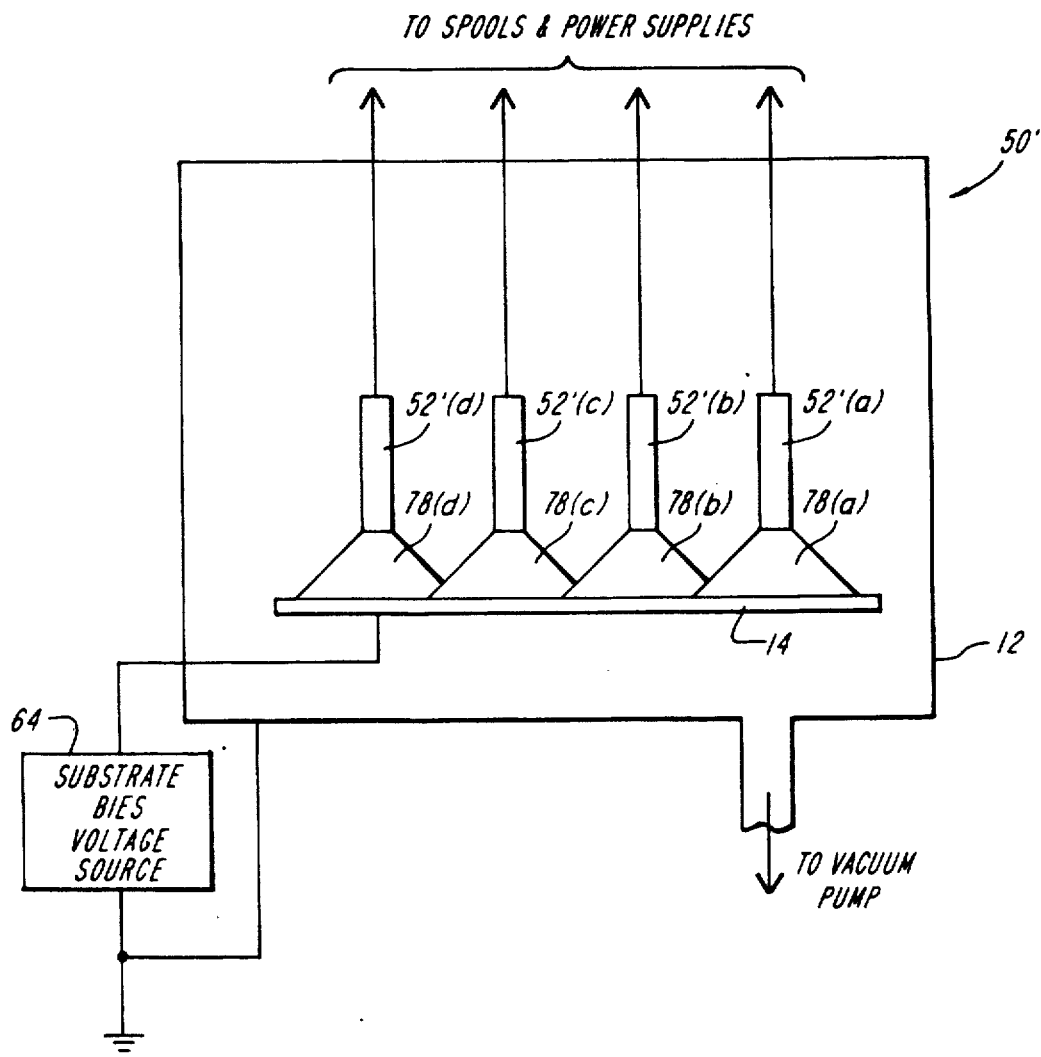
FIG. 5 is a highly schematic diagram depicting an embodiment of the invention utilizing a plurality of anodic vacuum arc electrodes.

One of the benefits of the coaxial electrode assembly 52' is that its small physical size permits several of the assemblies to be positioned adjacent one another. FIG. 5 depicts an arrangement of coaxial electrodes 52'(a)–52'(d) positioned adjacent a substrate 14 so as to provide increased area coverage. The coaxial electrode assemblies 52' are arranged such that the deposition vapor 78(a)–78(d) from each of the coaxial electrode assemblies 52' partially overlap. As in the previous embodiments each coaxial electrode assembly 52' has its own anodic wire spool (not shown). This arrangement provides a substantially uniform coating because the deposition profile is a cosine function with the highest deposition concentration directly beneath the coaxial electrode. Thus, the overlap of the deposition vapor from each electrode assembly 52' contributes to the uniformity of the coating.

Figure 6:
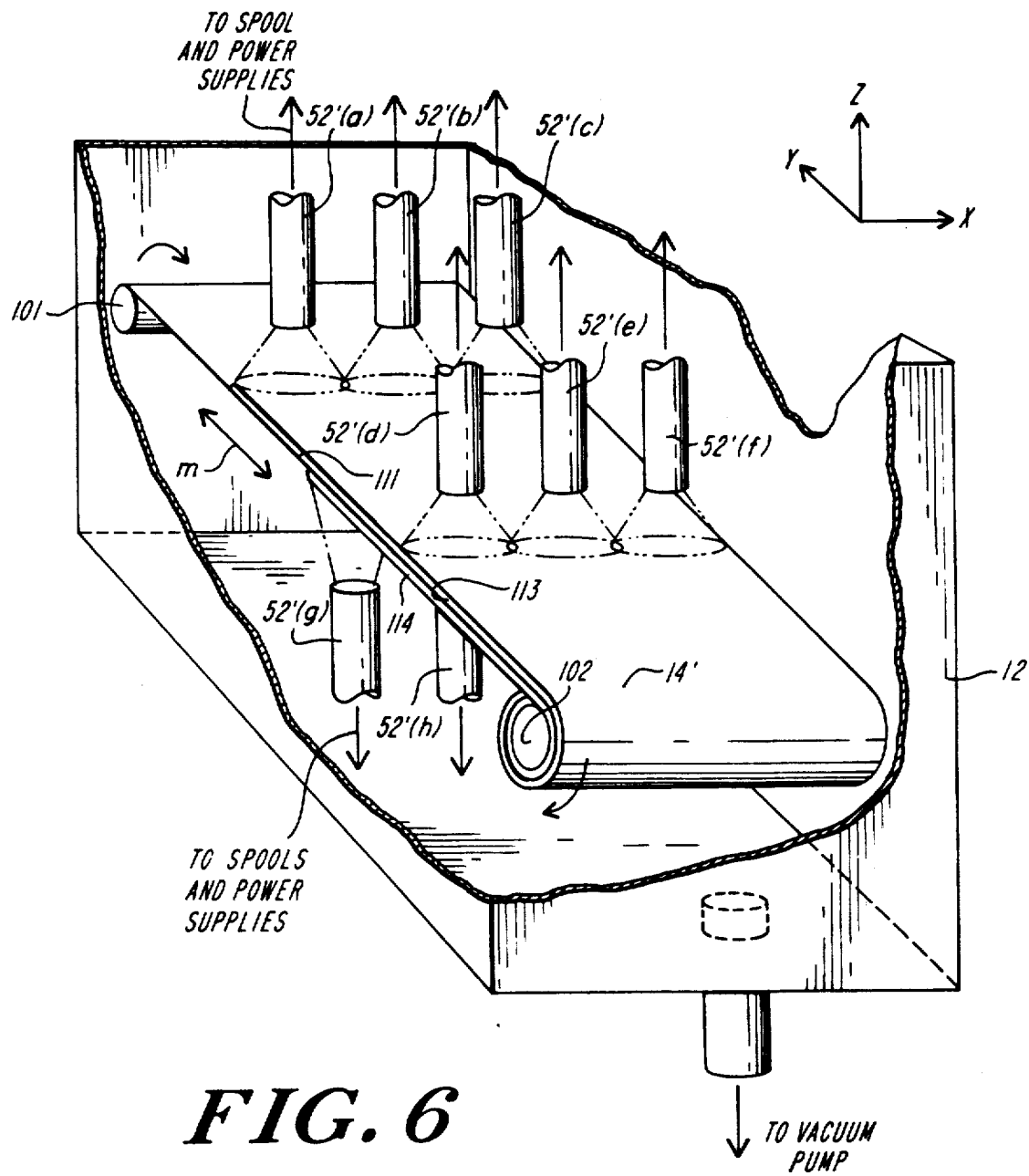
FIG. 6 is a perspective diagram depicting an embodiment of the invention utilizing a plurality of anodic vacuum arc electrodes for depositing a plurality of layers on a webbing substrate.
Figure 2:
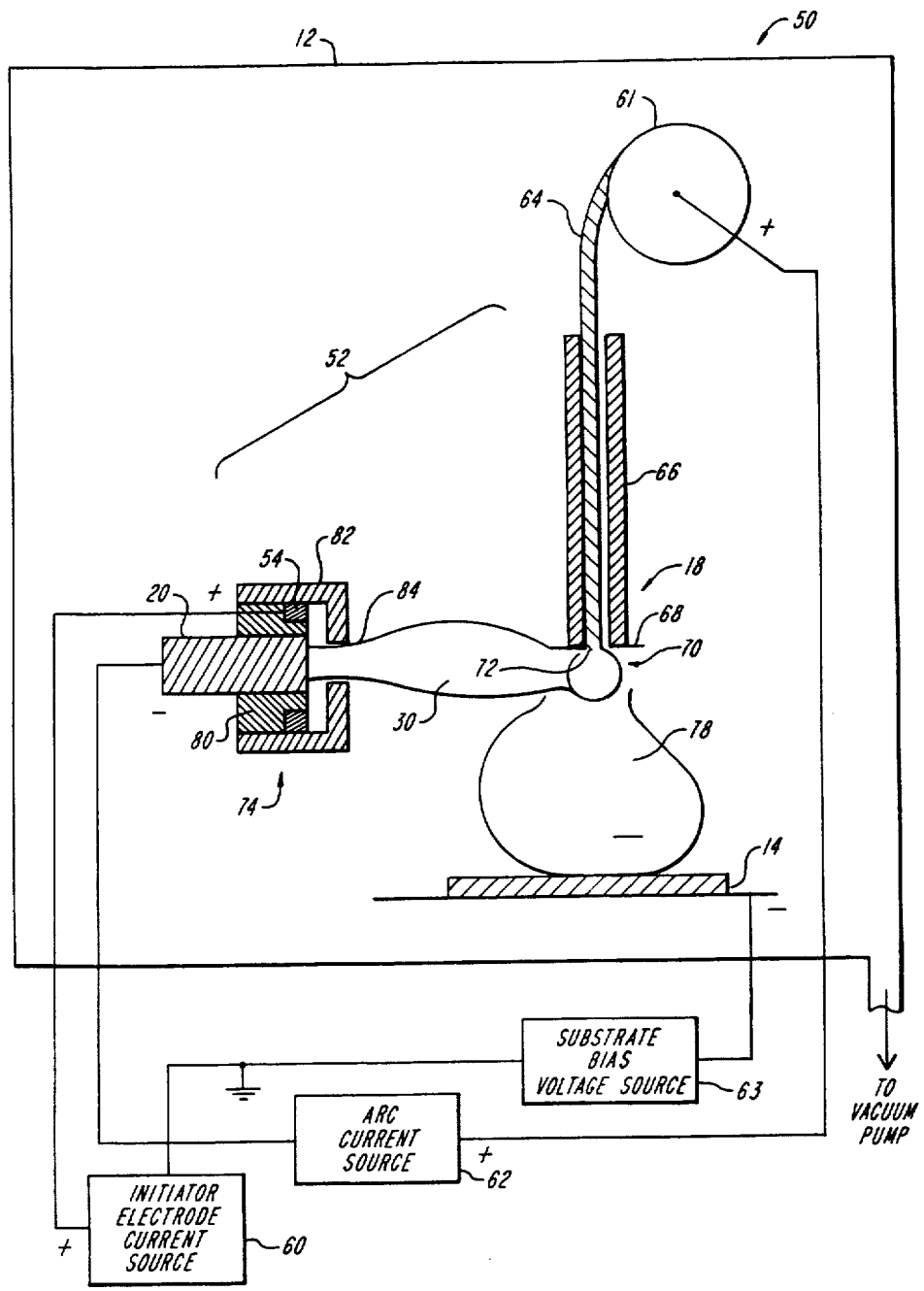
Figure 5:
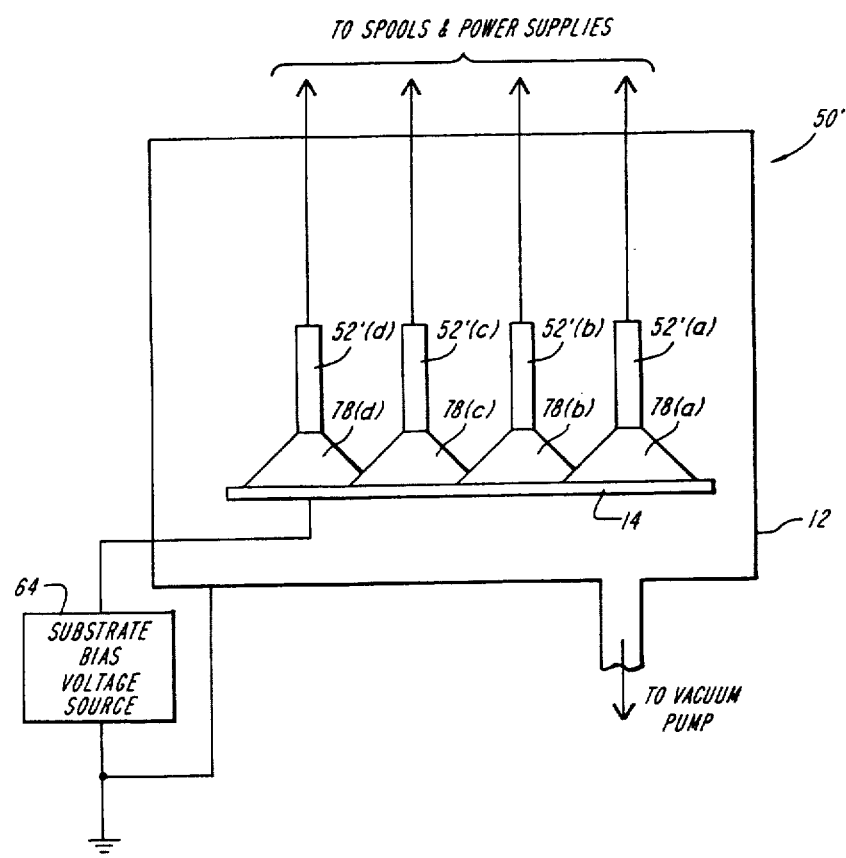

In addition to providing increased area coverage, multiple coaxial electrode assemblies 52' may be used to sequentially deposit different layers of materials on a substrate. An embodiment of the invention which permits multiple layers to be deposited as well as permitting the deposition coating of both sides of the substrate is shown in cutaway perspective in FIG. 6. In this embodiment the substrate to be coated is shown as a web substrate 14' which is played off a first reel 101 and taken up on a second reel 103. Although the reels 101, 103 are depicted as being located within a vacuum chamber 12, this need not be the case as long as the vacuum of the vacuum chamber is maintained. The reels 101, 103 are separated and are driven in such a way to permit the substrate 14' to move (arrow m) from one reel 101 to the other 103 while passing adjacent a plurality of coaxial electrodes 52'. Again each coaxial electrode is attached to its own anodic spool (not-shown).

In the embodiment shown the coaxial electrodes grouped together along the width of the chamber, the x-axis, for example 52'(a), 52'(b), 52'(c), are all depositing the same material and are arranged so as to provide the width of coverage required by the width of the substrate 14'. The different groups of coaxial electrodes located along the length of the chamber, the y-axis, each deposits a different material onto the substrate 14'. Thus, for example, the first group of coaxial electrodes 52'(a), 52'(b), 52'(c), would first deposit a layer of aluminum 111 on the substrate 14' as the substrate 14' passes below the coaxial electrodes 52'(a), 52'(b), 52'(c). Then the second group of coaxial electrodes 52'(d), 52'(e), 52'(f) would deposit a second material 113 such as copper upon the layer of aluminum 111 just 20 deposited on the substrate 14'. In addition, other coaxial electrodes, for example 52'(g), 52'(h), can be used to simultaneously deposit layers of material 114 on the other surface of the substrate 14'.

These and other examples of the concept of the invention illustrated above are intended by way of example and the actual scope of the invention is to be determined solely by from the scope of the following claims.

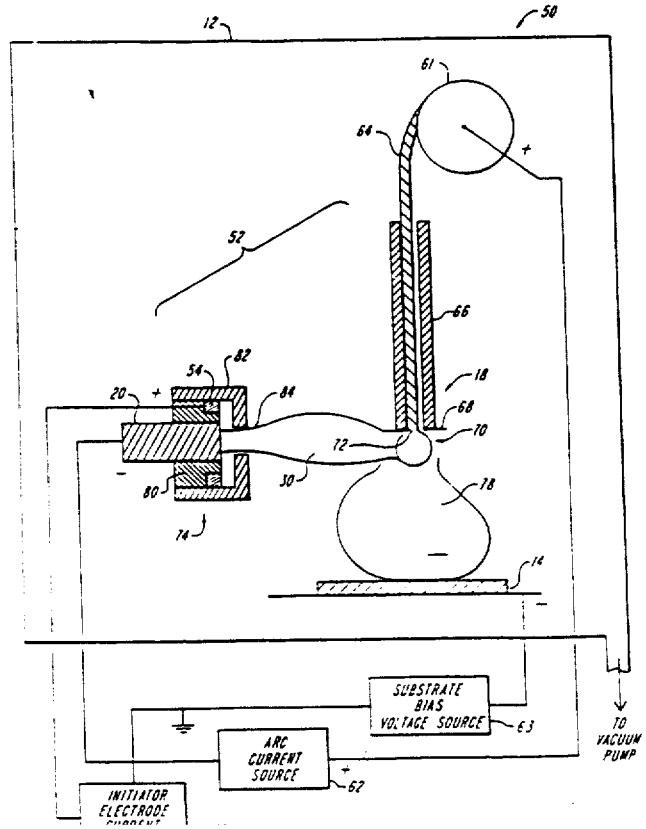

We claim:

1. A liquid anodic arc deposition system for depositing a material on a substrate comprising:
 a vacuum chamber;
 an anode assembly comprising:
  an anode of spooled wire of said material to be deposited, said spooled wire having a free end and a spooled end; and
 a cathode assembly comprising:
  a cathode; and
  an initiator electrode juxtaposed with and separated from
 said cathode by an insulator,
  said anode assembly and said cathode assembly located within said vacuum chamber in close juxtaposition,
  said anode, in use, forming a liquid region from which the deposition material is vaporized.

2. The liquid anodic arc deposition system of claim 1 wherein said anode assembly further comprises a tubular insulator having a first end and a second end, said free end of said anode of spooled wire passing through said first end of said tubular insulator and terminating adjacent said second end of said tubular insulator.

3. The liquid anodic arc deposition system of claim 1 wherein said anode assembly further comprises an insulating limiter having a limiter aperture, said insulating limiter positioned adjacent said second end of said tubular insulator such that said free end of said anode terminates adjacent said limiter aperture.

4. The liquid anodic arc deposition system of claim 1 wherein said cathode assembly further comprises a shield having a shield aperture, said shield partially surrounding said cathode and initiator electrode, said shield aperture being oriented so as to permit an arc to form between said anode and said cathode.

5. The liquid anodic arc deposition system of claim 1 further comprising an arc initiator current supply connected between said initiator electrode and said cathode electrode, a bias voltage supply connected between said substrate and said cathode and an arc current supply connected between said cathode and said anode.

6. The liquid anodic arc deposition system of claim 5 wherein said arc current supply comprises an arc initiation portion and an arc sustaining portion.

7. The liquid anodic arc deposition system of claim 5 wherein said arc initiator current supply comprises a high voltage source connected in series with a spark gap and connected in parallel with a capacitor.

8. A liquid anodic arc deposition system electrode assembly comprising:
 an insulating tube having a first end and a second end;
 an anode of spooled wire of material to be deposited, said anode of spooled wire having a free end and a spooled end, said free end of said anode passing through said first end of said insulating tube and terminating at said second end of said insulating tube;
 an annular cathode positioned concentrically about said insulating tube; and
 an annular initiator electrode positioned concentrically about said insulating tube and separated from said annular cathode by an insulator,
 said anode, in use, forming a liquid region from which the deposition material is vaporized.

9. The liquid anodic arc deposition system electrode assembly of claim 8 further comprising an insulating limiter having a first limiter aperture and a second limiter aperture, said insulating limiter positioned adjacent said second end of said insulating tube such that said free end of said anode terminates adjacent said first limiter aperture and said second limiter aperture is positioned to permit an arc to form between said anode and said cathode.

10. The liquid anodic arc deposition system electrode assembly of claim 8 further comprising a high thermal capacity material positioned between said anode and said insulating tube so as to prevent heat damage to said insulating tube.

11. The liquid anodic arc deposition system electrode assembly of claim 10 wherein said high thermal capacity material positioned between said anode and said insulating tube so as to prevent heat damage to said insulating tube is tungsten.

12. The liquid anodic arc deposition system electrode assembly of claim 10 wherein said high thermal capacity material positioned between said anode and said insulating tube so as to prevent heat damage to said insulating tube is carbon.

13. A liquid anodic arc deposition system comprising:
   a vacuum chamber;
   a plurality of anodic arc deposition system electrodes each comprising:
      an insulating tube having a first end and a second end;
      an anode of spooled wire or material to be deposited, said anode of spooled wire having a free end and a spooled end, said free end of said anode passing through said first end of said insulating tube and terminating at said second end of said insulating tube;
      an annular cathode positioned concentrically about said insulating tube; and
      an annular initiator electrode positioned concentrically about said insulating tube and separated from said annular cathode by an insulator,
   said plurality of said anodic arc deposition system electrodes located within said vacuum chamber and arranged in close juxtaposition, so as to provide a substantially even deposition coating to said substrate,
   each said anode, in use, forming a liquid region from which the deposition material is vaporized.

14. The liquid anodic arc deposition system electrode assembly of claim 13 wherein each anodic arc deposition system electrode further comprises an insulating limiter having a first limiter aperture and a second limiter aperture, said insulating limiter positioned adjacent said second end of said insulating tube such that said free end of each said anode terminates adjacent said first limiter aperture and said second limiter aperture is positioned to permit an arc to form between said anode and said cathode.

* * * * *

UNITED STATES PATENT AND TRADEMARK OFFICE
CERTIFICATE OF CORRECTION

PATENT NO. : 5,302,271
DATED : April 12, 1994
INVENTOR(S) : Chung Chan, et al

It is certified that error appears in the above-indentified patent and that said Letters Patent is hereby corrected as shown below:

In Figures 2 and 5 of the drawings, the word "BIES" should read --BIAS--. Enclosed is a corrected Title page for the issued patent showing the corrected Figure 2. Also enclosed are corrected Figures 2 and 5, which appear as sheet 2 of 6 and 5 of 6 of the issued patent.

Column 1, line 10, "to be and" should read --to be coated and--.

Column 1, line 16, "cathode of" should read --cathode 20 of--.

Column 5, line 55, "just 20 deposited" should read --just deposited--.

Signed and Sealed this

Eleventh Day of October, 1994

Attest:

BRUCE LEHMAN

Attesting Officer     Commissioner of Patents and Trademarks

United States Patent [19]

Chan et al.

[11] Patent Number: 5,302,271
[45] Date of Patent: Apr. 12, 1994

[54] ANODIC VACUUM ARC DEPOSITION SYSTEM

[75] Inventors: Chung Chan, West Newton; Steven Meassick, Sharon, both of Mass.

[73] Assignee: Northeastern University, Boston, Mass.

[21] Appl. No.: 934,925

[22] Filed: Aug. 25, 1992

[51] Int. Cl.⁵ .................................................. C23C 14/32
[52] U.S. Cl. ............................ 204/298.41; 204/192.38; 427/580
[58] Field of Search .................. 204/192.38, 298.41; 427/580

[56] References Cited

U.S. PATENT DOCUMENTS

| | | | |
|---|---|---|---|
| 3,158,805 | 11/1964 | Kalbfell | 360/1 |
| 4,917,786 | 4/1990 | Ehrich | 204/192.38 |
| 5,013,578 | 5/1991 | Brown et al. | 427/455 |
| 5,096,558 | 3/1992 | Ehrich | 204/192.38 |

OTHER PUBLICATIONS

"A Review of Anode Phenomena in Vacuum Arcs", by H. Craig Miller, IEEE Transactions on Plasma Science, vol. PS-13, Oct. 1985, pp. 242-252.
"Corrosion Protection By Vacuum Arc Coatings", by S. Bababeyge, et al., Interfinish 88, Paris, Oct. 1988.
"Transport of Vacuum Arc Plasma Through Straight and Curved Magnetic Cuts", by J. Storer, et al., Journal of Applied Physics, vol. 66, No. 11, Dec. 1989, pp. 5245-5249.
"Anode Voltage Drop and Anode Spot Formation in dc Vacuum Arcs" by C. W. Kimblin, Journal of Applied Physics, vol. 40, No. 4, Mar. 1969, pp. 1744-1752.
"The Anode Vacuum Arc. I. Basic Construction and Phenomenology", by H. Ehrick, Jun. 1987, pp. 134-138.
"Anodic Vacuum Arc. II. Experimental Study of Arc Plasma", by H. Ehrick, et al., Sep. 1987, pp. 2499-2503.
"Principles and Applications of Vacuum Arc Coatings", by R. L. Boxman, et al., XIIIth Internation Symposium on Discharges and Electrical Insulation in Vacuum, Paris, 1988.
"Anode Surface Radiance From Microsecond Vacuum Arcs", by J. T. Grissom, et al., Journal of Applied Physics, vol. 45, No. 7, Jul. 1974, pp. 2885-2894.
"Vacuum Arc Anode Plasma I. Spectroscopic Investigation", by F. M. Bacon, Journal of Applied Physics, vol. 46., No. 11, Nov. 1975, pp. 4750-4757.

Primary Examiner—Aaron Weisstuch
Attorney, Agent, or Firm—Weingarten, Schurgin, Gagnebin & Hayes

[57] ABSTRACT

An anodic vacuum arc deposition system for rapidly depositing a high quality, small grain size, coating on a workpiece. The anodic vacuum arc deposition system includes an arc initiator and an anodic electrode having a continuous feed. The anodic vacuum arc deposition system may be configured with a coaxial anode and cathode. A plurality of coaxial electrodes may be used to deposition coat a large area and/or to sequentially deposit a series of layers each of a different material.

14 Claims, 6 Drawing Sheets